United States Patent [19]
Wright

[11] Patent Number: 6,112,020
[45] Date of Patent: Aug. 29, 2000

[54] APPARATUS AND METHOD FOR GENERATING CONFIGURATION AND TEST FILES FOR PROGRAMMABLE LOGIC DEVICES

[75] Inventor: Adam Wright, Santa Clara, Calif.

[73] Assignee: Altera Corporation, San Jose, Calif.

[21] Appl. No.: 08/863,494

[22] Filed: May 27, 1997

Related U.S. Application Data

[60] Provisional application No. 60/029,449, Oct. 31, 1996.

[51] Int. Cl.[7] .................................................. G06F 17/50
[52] U.S. Cl. ........................ 395/500.18; 716/18; 716/19; 717/1
[58] Field of Search ................... 364/488–491; 326/39, 41; 395/500.18, 500.17, 500.19, 701, 702, 703, 704, 705

[56] References Cited

U.S. PATENT DOCUMENTS

| | | | |
|---|---|---|---|
| 5,336,950 | 8/1994 | Popli et al. ................. | 326/39 |
| 5,338,984 | 8/1994 | Sutherland ................. | 326/41 |
| 5,452,231 | 9/1995 | Butts et al. ................. | 364/489 |
| 5,455,525 | 10/1995 | Ho et al. ................. | 326/41 |
| 5,535,406 | 7/1996 | Kolchinsky ................. | 395/800.1 |
| 5,552,722 | 9/1996 | Kean ................. | 326/41 |
| 5,590,305 | 12/1996 | Terrill et al. ................. | 711/103 |
| 5,596,743 | 1/1997 | Bhat et al. ................. | 395/500 |
| 5,603,043 | 2/1997 | Taylor et al. ................. | 712/1 |
| 5,634,058 | 5/1997 | Allen et al. ................. | 395/712 |
| 5,903,475 | 5/1999 | Gupte et al. ................. | 395/500.37 |

*Primary Examiner*—Paul R. Lintz
*Assistant Examiner*—Vuthe Siek
*Attorney, Agent, or Firm*—William S. Galliani; Pennie & Edmonds LLP

[57] ABSTRACT

An apparatus and method for generating configuration and test files for programmable logic devices includes a dynamic configuration and test generation program to specify, in source code, a logic function to be implemented by a programmable logic device. A device test development kernel program has information characterizing physical elements of the programmable logic device and bit patterns for implementing connections between the physical elements of the programmable logic device. The device test development kernel program converts the logic function into a configuration file for use in programming the logic function into the programmable logic device. The dynamic configuration and test generation program also specifies, in source code, a test operation to be executed by the programmable logic device. It operates with the device test development kernel program to produce a vector file for use in testing the programmable logic device.

12 Claims, 6 Drawing Sheets

APPARATUS AND METHOD FOR GENERATING CONFIGURATION AND TEST FILES FOR PROGRAMMABLE LOGIC DEVICES

This application claims priority to the provisional application entitled "Apparatus and Method for Generating Configuration and Test Programs for Programmable Logic Devices", Ser. No. 60/029,449, filed Oct. 31, 1996.

BRIEF DESCRIPTION OF THE INVENTION

This invention relates generally to the programming and testing of programmable logic devices. More particularly, this invention relates to a generalized approach to generating configuration and test programs for a variety of programmable logic devices.

BACKGROUND OF THE INVENTION

Programmable logic devices are used in a variety of electronic equipment. Each programmable logic device is initially a "blank slate" that can be programmed to implement specified functions. The advantage of a programmable logic device is that it is relatively inexpensive since a mass-produced device can be created and subsequently programmed to perform a specified function. This approach is less expensive than designing an application specific integrated circuit (ASIC) to implement the same function.

The Flex 10K family of programmable logic devices sold by Altera Corporation, San Jose, Calif., is widely known in the art. Each Flex 10K programmable logic device includes an embedded array and a logic array. The embedded array is used to implement general logic in a conventional "sea-of-gates" architecture. In addition, the embedded array has dedicated die areas for implementing large, specialized programmable functions. In particular, the embedded array can be used to implement memory functions, such as random access memory (RAM), read only memory (ROM), and first-in-first-out (FIFO) functions. In addition, the embedded array can be used to implement logic functions, such as multipliers, microcontrollers, and state machines. Logic functions are implemented by programming the embedded array with a read-only pattern during configuration, thereby creating a large look-up table (LUT). In this LUT, combinatorial functions are implemented by looking up the results, rather than by computing them. This implementation of combinatorial functions is faster than using algorithms implemented in general logic.

The logic array portion of the Flex 10K programmable logic device is also used to implement logic functions. That is, it is used to implement general logic, such as counters, adders, state machines, and multiplexers. The logic array has a larger die area and slower speed compared to the embedded array.

A programmable logic device, such as a Flex 10K programmable logic device, is configured to implement specified functions. A configuration file is used to implement the specified functions. In other words, an engineer generates a configuration file which is used to configure a programmable logic device to perfrom a set of specified functions.

Once a configuration file is established, it is necessary to test the operation of the proposed configuration. A test file is used for this purpose.

Thus, in order to implement a programmable logic device, it is necessary to establish a configuration file and a test file. These files are generally generated through the use of a bit-level static configuration and test generation program. FIG. 1 illustrates a bit-level static configuration and test generation program 20A in accordance with the prior art. The figure also illustrates that the program is used to produce a configuration file 22A and a test (or vector) file 24A. These two files are then applied to a configurable device (programmable logic device) 26A. That is, the configuration file 22A is initially used to configure the configurable device 26A. Thereafter, the test file 24A is applied to the configurable device 26A to confirm that it is operating as intended.

FIG. 1 illustrates that configurable device 26A has a corresponding bit-level static configuration and test generation program 20A. Similarly, other configurable devices, A through N, each have a dedicated bit-level static configuration and test generation programs 20A–20N. In other words, in the prior art, it is necessary to construct a bit-level static configuration and test generation program for each configurable device. This approach is obviously problematic because it requires a large number of programs. Moreover, this approach is problematic because an operator of the program must have a bit-level understanding of the configurable device that is being worked with.

In view of the foregoing, it would be highly desirable to generate a single configuration and test generation program that could be used for a variety of configurable devices. Preferably, such a program would not require a bit-level understanding of the configurable device to be programmed. In other words, preferably, a more generalized approach to device programming and testing would be afforded.

SUMMARY OF THE INVENTION

An apparatus and method for generating configuration and test files for programmable logic devices includes a dynamic configuration and test generation program to specify, in source code, a logic function to be implemented by a programmable logic device. A device test development kernel program has information characterizing physical elements of the programmable logic device and bit patterns for implementing connections between the physical elements of the programmable logic device. The device test development kernel program converts the logic function into a configuration file for use in programming the logic function into the programmable logic device. The dynamic configuration and test generation program also specifies, in source code, a test operation to be executed by the programmable logic device. It operates with the device test development kernel program to produce a vector file for use in testing the programmable logic device.

The invention provides a single configuration and test generation program for use with a variety of configurable devices. Further, the invention provides a more generalized approach to device configuration and testing, as the bit-level details of such operations are automatically performed by the device test development kernels.

BRIEF DESCRIPTION OF THE DRAWINGS

For a better understanding of the nature and objects of the invention, reference should be made to the following detailed description taken in conjunction with the accompanying drawings, in which.

Like reference numerals refer to corresponding parts throughout the several views of the drawings.

DETAILED DESCRIPTION OF THE INVENTION

Figure 1:
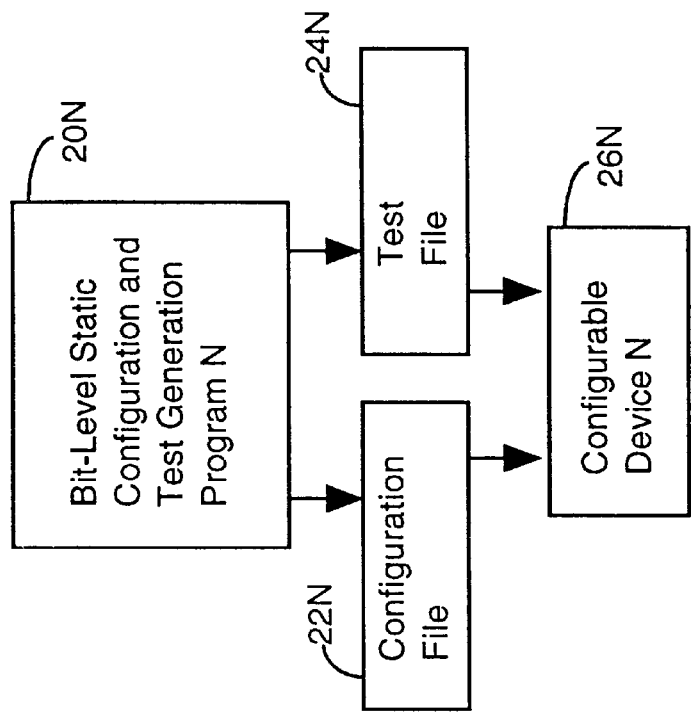
FIG. 1 illustrates discrete bit-level static configuration and test generation programs for corresponding discrete programmable logic devices, in accordance with the prior art.
Figure 1:
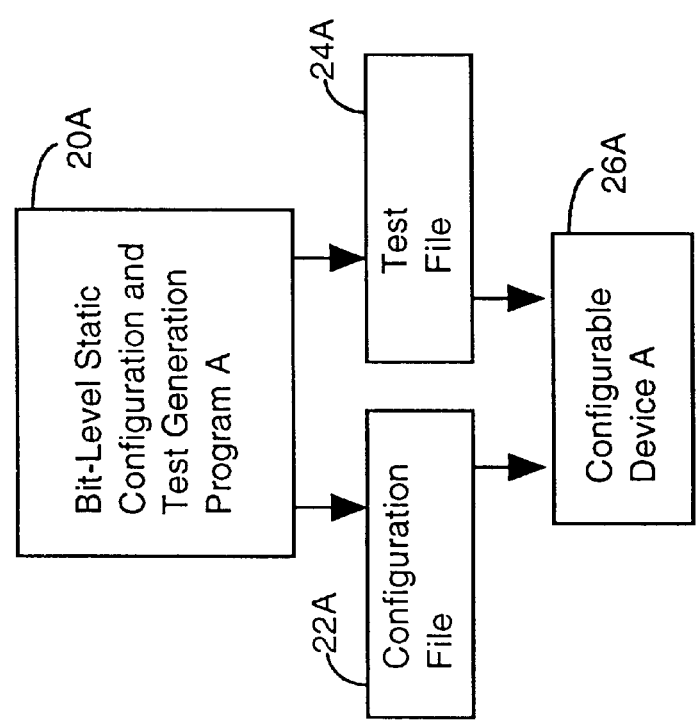
Figure 2:
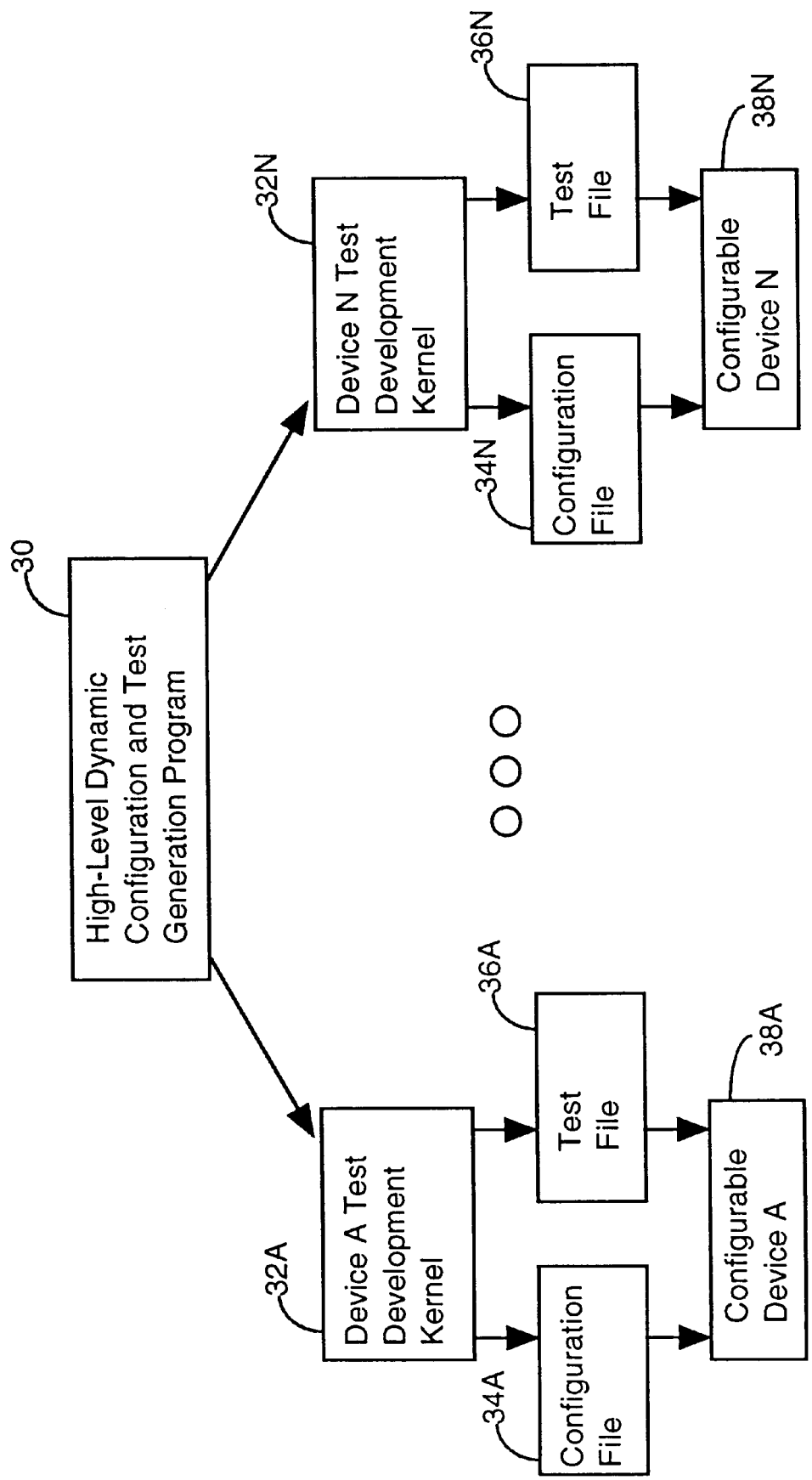
FIG. 2 illustrates a high-level dynamic configuration and test generation program and accompanying device development kernels for use with a variety of programmable logic devices, in accordance with an embodiment of the invention.

FIG. 2 illustrates a high-level dynamic configuration and test generation program 30 in accordance with an embodiment of the invention. As its name implies, the program 30 does not operate at a bit-level, but at a more general level, to produce a configuration file 34 and a test file 36. FIG. 2 also illustrates that the program 30 is used to configure a set of configurable devices 38A–38N. Each configurable device 38A–38N has a common internal architecture, but that architecture is scaled to a different size. Thus, the configurable devices 38A–38N have different sizes and internal resources.

The high-level dynamic configuration and test generation program 30 interacts with a set of device test development kernel programs 32A–32N. Each device test development kernel program 32 includes bit-level information for a corresponding configurable device 38. Thus, generalized configuration and test information is supplied at the high-level dynamic test generation program 30. The program 30 then calls a specified device test development kernel program 32. The device test development kernel program 32 converts the generally specified information from the high-level dynamic configuration and test generation program 30 into bit level information that is used to generate a configuration file 34 and a test file 36.

For example, in one embodiment of the invention, the high-level dynamic configuration and test generation program 30 is implemented to support a procedure "ConnectResourceAtoResourceB", which has software parameters representing resource A and resource B. Thus, the user of program 30 simply calls the procedure and specifies a resource A and a resource B in order to make a connection between the two resources. This information is then processed by a device test development kernel program 32 to generate the bit-level commands that are necessary to implement this operation. That is, the device test development kernel program 32 generates a sequence of bit-level commands for application to different resources of the configurable device so that the generally characterized connect resource A to resource B operation is specifically implemented in the configurable device. This specific implementation is performed automatically and transparently to the user.

Figure 3:
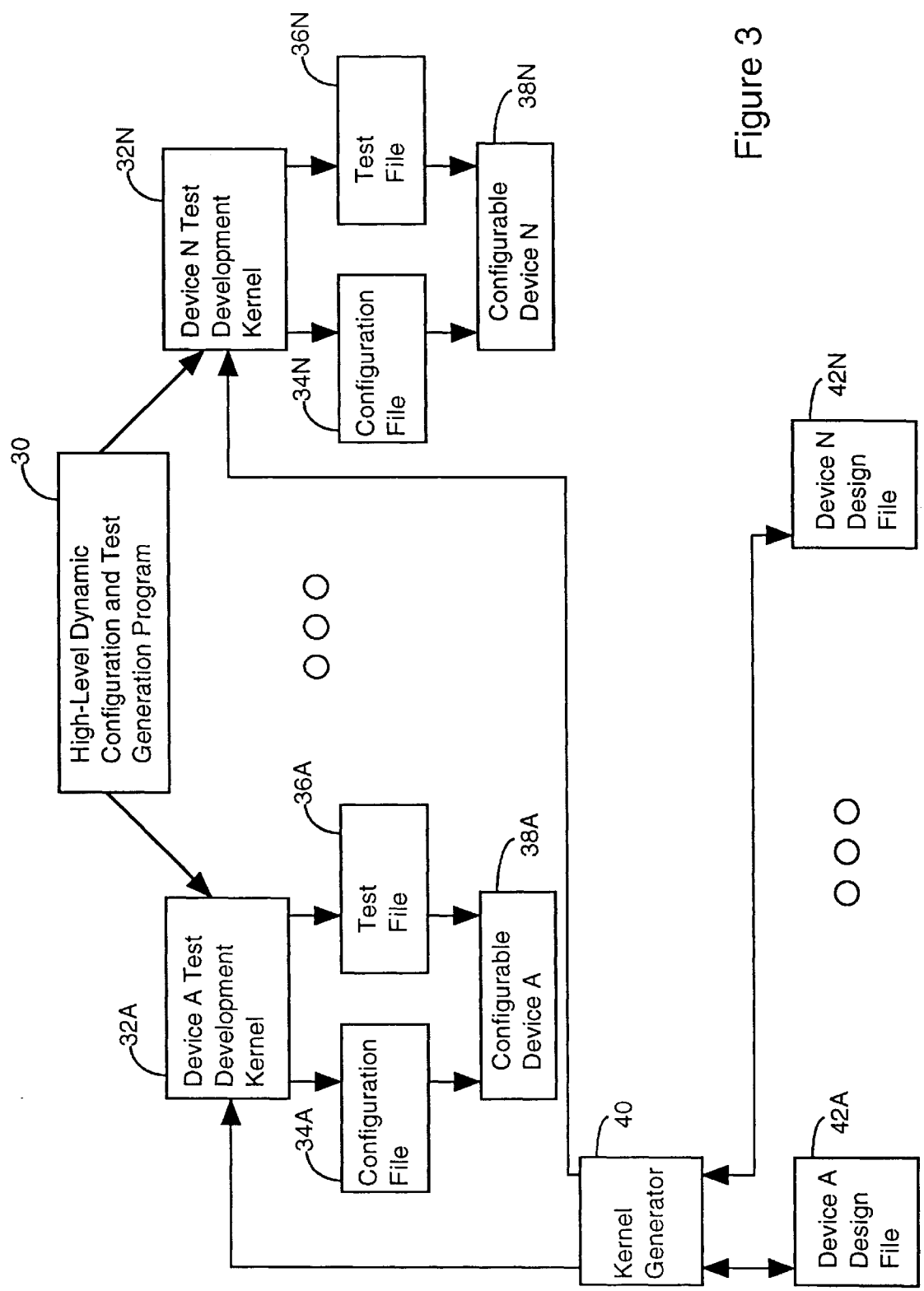
FIG. 3 illustrates a kernel generator and accompanying device design files for constructing device test development kernels, in accordance with an embodiment of the invention.

FIG. 3 generally corresponds to FIG. 2, but also illustrates a kernel generator program 40. The kernel generator program 40 is used to construct each device test development kernel program 32. In particular, the kernel generator program 40 accesses a device design file, say device A design file 42A, to generate a device test development kernel program, say device A test development kernel program 32A. Each design file 42 may be in the form of a text file that specifies all of the device resources and the connections between those resources. The kernel generator program 40 uses this device information to generate an appropriate device test development kernel program, as discussed below.

Figure 4:
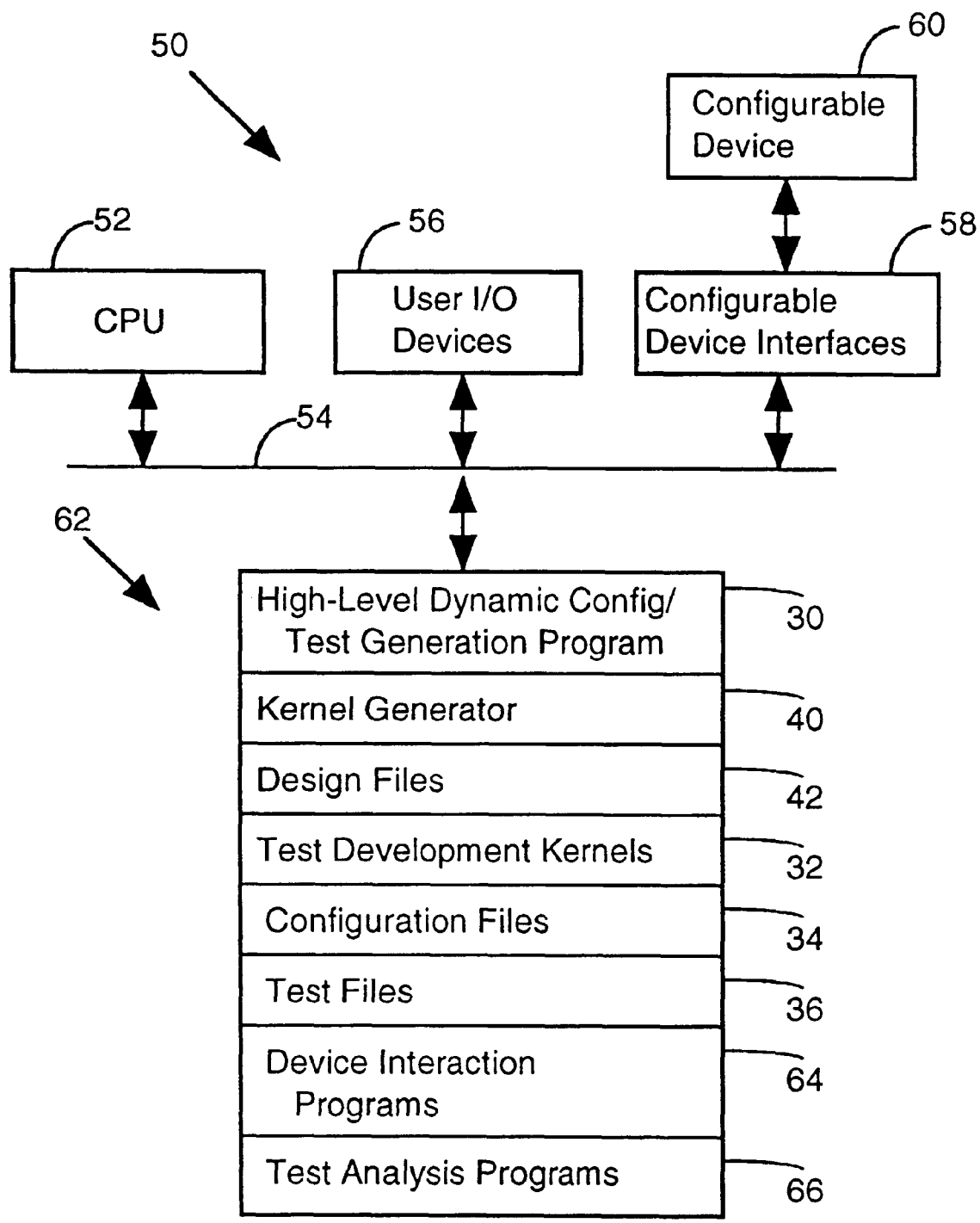
FIG. 4 illustrates an apparatus constructed in accordance with an embodiment of the invention.

FIG. 4 illustrates an apparatus 50 constructed in accordance with an embodiment of the invention. The apparatus 50 includes a central processing unit 52 connected to a system bus 54, which is connected to user input/output devices 56, such as a keyboard, mouse, monitor, and printer. The system bus 54 is also connected to configurable device interfaces 58. The configurable device interfaces 58 include known devices that are used to download a configuration file into a configurable device 60. The configurable device interfaces 58 also include interfaces to apply test data to the configurable device 60 and to gather test output vectors from the configurable device 60.

The system bus 54 is also connected to a memory 62. The interaction between elements 52 and 62 is known in the art. The invention is directed toward the executable programs stored in the memory 62. One executable program stored in memory 62 is the previously described high-level dynamic configuration and test generation program 30. The memory 62 also stores the previously described kernel generator program 40, design files 42, and test development kernel programs 32. The foregoing programs produce configuration files 34 and test files 36. The memory 62 also stores device interaction programs 64 that are used to interact with the configurable device interfaces 58. Finally, the memory 62 stores test analysis programs 66 which are used to confirm that the results of the test operations are correct.

Figure 5:
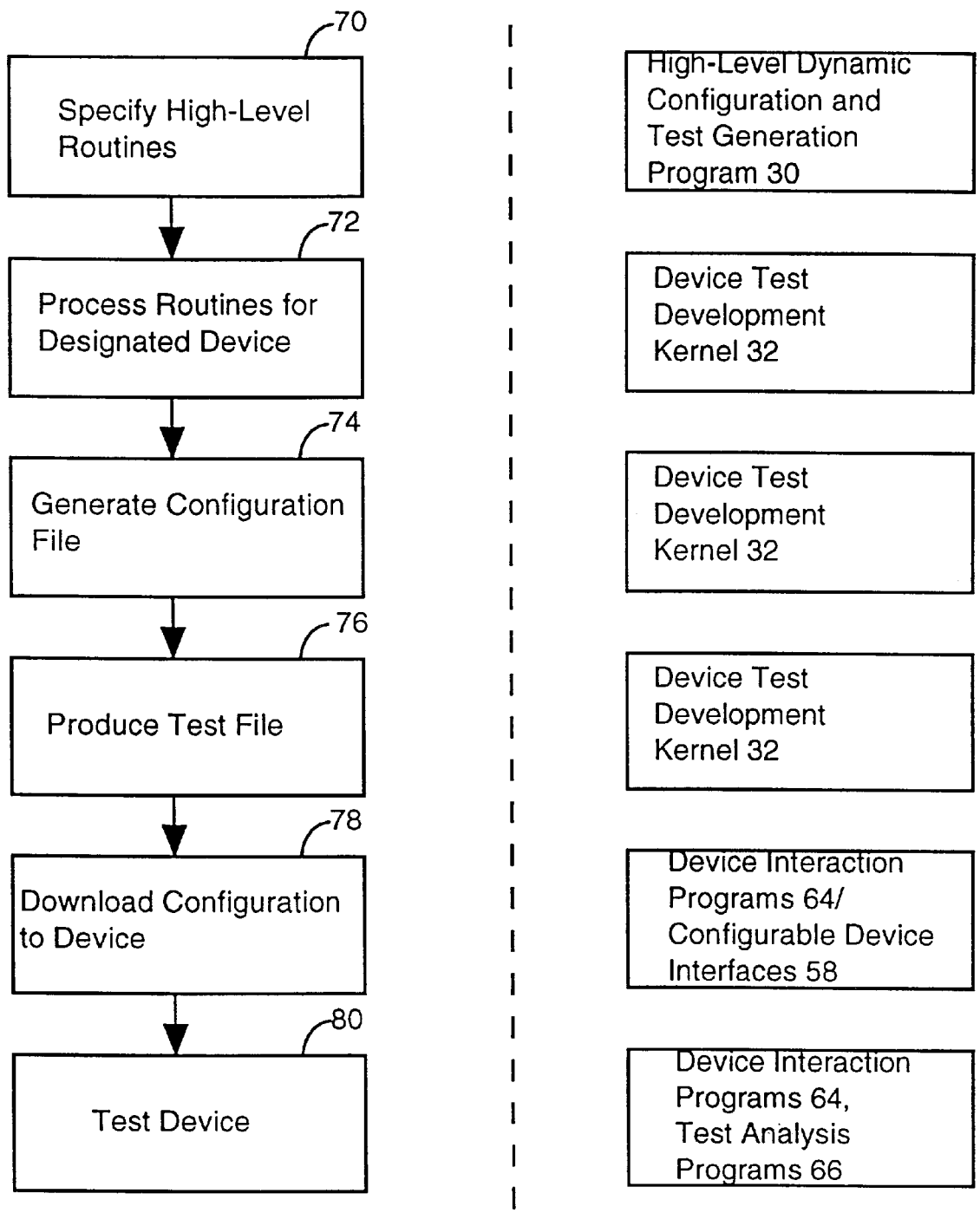
FIG. 5 illustrates processing steps and corresponding devices for performing the processing steps, in accordance with an embodiment of the invention.

FIG. 5 illustrates processing steps that are executed in accordance with an embodiment of the invention. In particular, the figure illustrates processing steps 70–80 on the left-hand side of the figure and the corresponding elements to perform those operations on the right-hand side of the figure.

The first processing step is to specify high-level routines or logic functions (step 70). For example, as described above, the high-level logic function or routine may be the procedure "ConnectResourceAtoResourceB". This routine may be used to configure a device and to test a device. This routine is specified to the high-level dynamic configuration and test generation program 30.

The next step is to process the routine in reference to a designated device (step 72). In other words, the specified high-level routine describes a designated device and a routine to be performed in reference to that device. The device test development kernel program 32 for the specified device is used, for example, to convert the general instruction to connect resources into a specific set of commands that are used to establish the connection between the resources. Those commands are placed in a configuration file. In other words, a configuration file is generated (step 74) through the processing of the routines. Similarly, a test file is produced (step 76) through the processing of the routines. In other words, routines are selected for configuration purposes and test purposes. The device test development kernel program 32 transforms this information into a configuration file and a test file.

The next processing step is to download the configuration to the configurable device (step 78). This operation can be performed through the use of the device interaction programs 64 and the configurable device interfaces 58. The final processing step is to test the device (step 80). This processing step uses the test files 36, the device interaction programs 64, and the test analysis programs 66.

The invention has now been fully described. The invention has been described in reference to known elements such as a CPU 52, user input/output devices 56, configurable device interfaces 58, device interaction programs 64, and test analysis programs 66. The invention is directed toward the combination of these known elements with the following novel elements of the invention: the high-level dynamic configuration and test generation program 30, the device development kernel programs 32, the kernel generator program 40, and the related configuration files 34, test files 36, and device design files 42. Attention presently turns to a more detailed discussion of an example of a high-level dynamic configuration and test generation program 30, in accordance with an embodiment of the invention. The discussion of this element will more fully demonstrate the operation of the invention.

Figure 6:
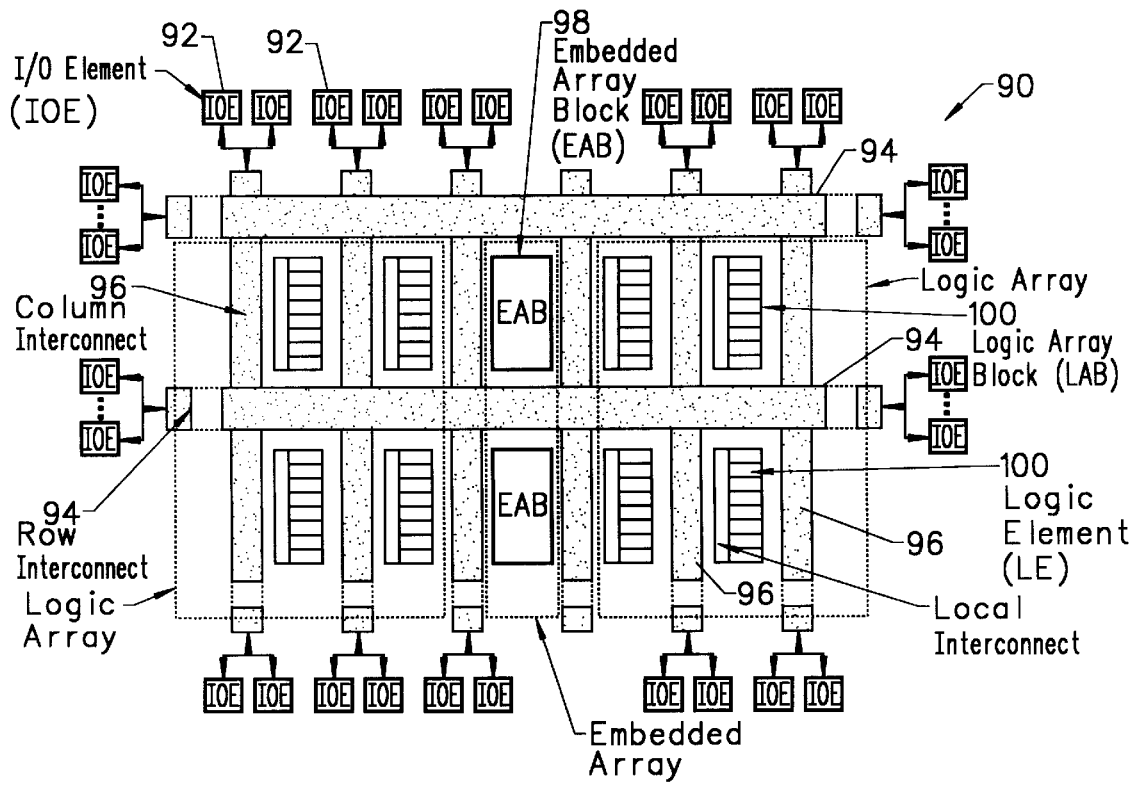
FIG. 6 illustrates a programmable logic device that may be programmed and tested in accordance with the invention.

The example high-level dynamic configuration and test generation program 30 provided below operates to program a device of the type shown in FIG. 6. FIG. 6 illustrates a programmable logic device (PLD) 90, from the Flex 10K family of logic devices sold by Altera Corporation, San Jose, Calif. The PLD 90 includes a set of input/output elements 92, which are connected to input/output pins (not shown) ofthe PLD 90. The input/output elements 92 are used to route signals to and from the PLD 90. The device 90 also includes row interconnection circuitry 94 and column interconnection circuitry 96. Embedded array blocks 98 and logic array blocks 100 are positioned between the row interconnection circuitry 94 and the column interconnection circuitry 96.

Figure 7:
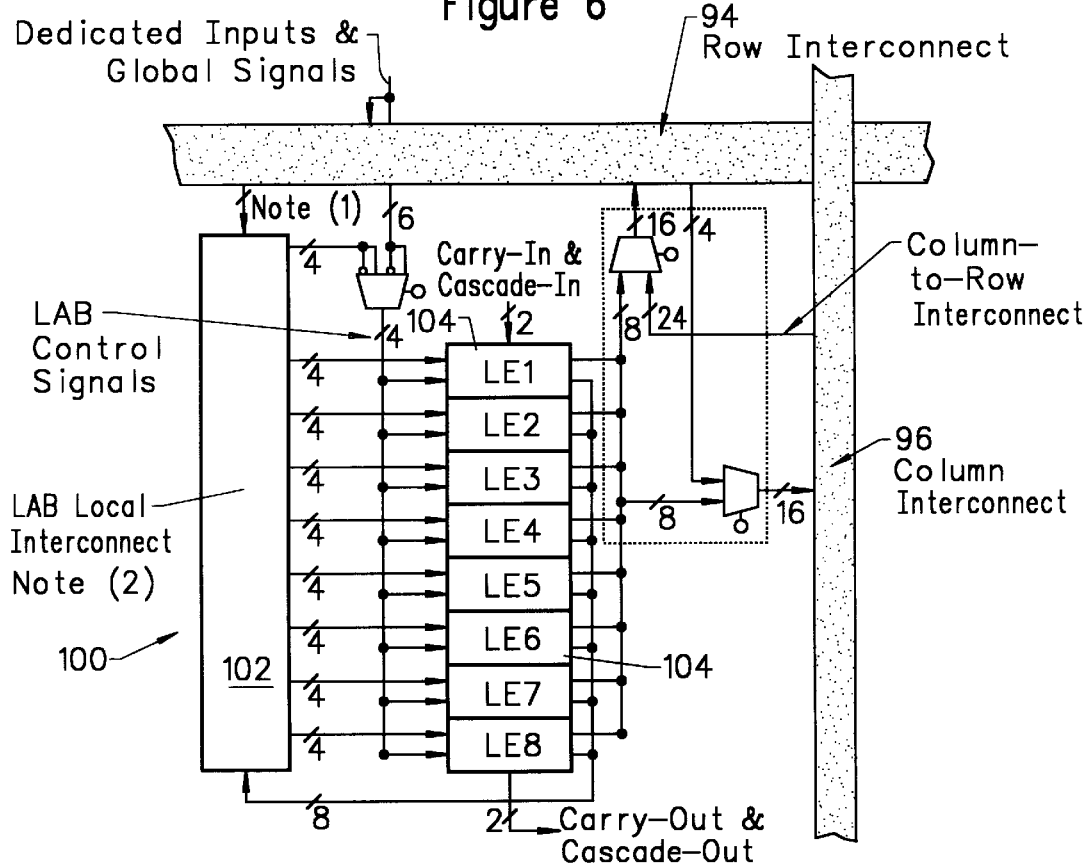
FIG. 7 illustrates a logic array block of the programmable logic device of FIG. 6.

FIG. 7 is a more detailed view of a logic array block 100. As shown, the logic array block 100 is connected to row interconnect circuitry 94 and column interconnect circuitry 96. Local interconnect circuitry 102 is used to route signals within the logic array block 100. A set of logic array elements 104 is used to store look-up tables, which specify a logical function. In other words, each look-up table receives a set of input signals, which are mapped to a value in the look-up table; that value is then used as the output signal. The output signal is routed out of the PLD 90 using the row interconnection circuitry 94 and the column interconnection circuitry 96.

FIGS. 6 and 7 illustrate the complexity of programming a PLD 90. For example, if a bit is to be set in a certain logic element 104, then that signal, and its accompanying control signals, must be routed through an input/output element 92, through row interconnection circuitry 94 and/or column interconnection circuitry 96, and into a specified location in a specified logic element 104. Then, to test whether the bit was set correctly, another set of signals must be routed through an input/output element 92, through row interconnection circuitry 94 and/or column interconnection circuitry 96, and to a specified logic element 104. As previously indicated, in the prior art, the instructions to perform these operations are generated through a custom program. To create the custom program, the programmer must be aware of how to program the PLD 90. In particular, the programmer must have a bit-level understanding of the device to be programmed so that bit-level instructions can be written to route a signal through the PLD 90. This becomes particularly complex when a programmer is forced to have knowledge of a number of PLD devices. For example, the Flex 10K family of logic devices sold by Altera Corporation, San Jose, Calif., has seven different types of PLDs, ranging from 7,000 to 158,000 usable gates. Thus, applying prior art techniques to these devices would result in seven separate programs for the seven different types of PLDs.

The present invention exploits the fact that certain families of PLDs have different numbers of gates, but they share a common architecture. For example, the Flex 10K family of logic devices sold by Altera Corporation, San Jose, Calif., has a single architecture, but different sized devices (with different numbers of gates) implement that architecture. For example, two devices may have the same overall architecture, as shown in FIG. 6, but one device may have row interconnection circuitry 94 (FIG. 6) with 8 signal lines, while another device may have row interconnection circuitry 94 with 16 signal lines.

The high-level dynamic configuration and test generation program 30 is written to implement a function that is to be performed by a PLD 90 with a specified architecture. The program is written in such a way that it is easily adapted to apply to different PLDs with the same architecture, but with different sizes implementing the architecture.

As its name indicates, the program 30 is written at a high-level, so that detailed understanding of the bit-level operation of the PLD is not necessary. Instead, general functions are specified, then the program 30 calls a specific device test development kernel program 32 to implement the detailed, bit-level operations for the corresponding PLD.

The following code is an example of a high-level dynamic configuration and test generation program that has been used to program the Flex 10K family of logic devices sold by Altera Corporation, San Jose, Calif. The operation of the code is documented, however, by way of overview, the code illustrates the implementation of a simple operation of toggling the output of a specified input/output element 92. More particularly, the code is used to route a signal from a specified input/output element 92, through a global horizontal routing line (of the row interconnection circuitry 94), to another input/output element 92.

The high-level dynamic configuration and test generation program 30 in this example is a procedure called "TIOGeneratorObject.CreateGHToOEControlTest". The title indicates that the program Toggles an Input-Output (TIO) element. The title also indicates that to do this one creates a global horizontal (GH) to output enable (OE) control test. The term "global horizontal" refers to row interconnection circuitry 94. Thus, in this example, the high-level dynamic configuration and test generation program 30 is used to implement a toggle function of an input-output element 92. Naturally, other operations can be implemented in accordance with the invention.

Procedure TIOGeneratorObject.CreateGHToOEControlTest; type

The following code defines some of the data structures used in the program 30. The record "TFastPathRec" keeps track of the resources used to route the signal input on a FAST pin to a global horizontal line. That global horizontal line will, in turn, control the output enable controls of an input-output element 92. A FAST pin is a package pin that has a dedicated connection (the connection is not multiplexed) to an internal resource of a PLD.

```
TFastPathRec = record
        ll          : tLL__Enum;
        column      : TCol__Enum;
        gh          : TGH__HH__Enum;
        lm          : TLM__Enum;
    end;
```

The following code defines some variables, including an array "TfastPathArray". Each input-output cell has it's output enable controlled by a different global horizontal line. TfastPathArray keeps track of the connections made to each of the input-output cells in a single row.

```
TFastPathArray = Array [ TRLIO__Enum ] of TFastPathRec;
var
    tbio            TTBIO__Enum;
    fastToOE        : TFastPathArray;
    connectionFound : boolean;
    col             : TCol__Enum;
    ok              : TConnect__Result__Enum;
    inputNumber     : integer;
    rlio            TRLIO__Enum;
    gvHiLo          : TLowHighEnum;
    gv              TGV__Enum;
    gh              : TGH__HH__Enum;
    row             : TRow__Enum;
    lmIn            : TLMInEnum;
```

The following code begins the process of establishing the path between the signal from the FAST pin to the global horizontal lines. The connection information is provided in the device test development kernel program 32.

As previously indicated, the kernel generator program 40 is preferably used to produce the development kernel program 32. Also indicated above is the fact that the kernel generator program 40 relies upon a device design file 42 to create a device test development kernel program 32. The device design file 42 includes information defining the connected elements of a PLD and the bit patterns required to program the connected elements.

The device test development kernel program 32 essentially embodies the information from the device design file 42. This information is incorporated into data structures within the development kernel program 32. Those skilled in the art can readily implement a kernel generator program 40 to read a design file 42 and construct a device test development kernel program 32 which stores a set design parameters from the design file 42 in data structures of the device test development kernel program 32.

The configuration program 30 can retrieve the information from the development kernel program 32, as shown below. Thus, the development kernel program 32 provides information to the configuration program 30, in addition, the development kernel program 32 generates the bit map or sequence of bit patterns for the configuration file 34, which is used to program the PLD 90.

The code below illustrates how the program 30 passes parameters to the development kernel 32 corresponding to the PLD to be programmed. The immediately following code simply defines some variables for future use.

```
Procedure SetupFastToGH;
var
    ll          : TLL__Enum;
    muxBit      : TMuxBit__Enum;
    localCol    : TCol__Enum;
    localLM     : TLM__Enum;
begin
```

The following code is used to query the device test development kernel program 30 on how to make a connection between specified physical elements of the PLD. In particular, the code is used to identify a LAB (logic array block) line (ll) that will provide connection to the FAST input-output element. The information is subsequently used to make the connection, as described below.

```
forll := MIN__LL to MAX__LL do
    begin
        for muxbit := MUXBIT__0 to MAX__GHIN__MUX do
            begin
                if GHIN__DESCRAMBLE [ ll, Ord ( muxBit) ] = FAST__0 then
                    begin
                        fastToOE [ rlio ].ll := ll;
                    end;
            end;
    end;
```

The following code is used to find the logic element 104 that can drive the global horizontal line (of the row interconnect circuitry 94) that will toggle the input-output element 92.

```
for localCol := MIN__COL to TCol__Enum ( Ord ( MAX__COL ) div 2 ) do
    begin
        for localLM := LM__0 to LM__7 do
            begin
                ifGV2GH__GHDRIVEN [ Ord ( localCol ), localLm ] =
                    fastToOE [ rlio ].gh then
                    begin
                        fastToOE [ rlio ].column := localCol;
                        fastToOE [ rlio ].lm    := localLM;
                    end;
            end;
    end;
if fastToOE [ rlio ].column = COL__URAM then
    begin
```

-continued

```
        Writeln ( 'Unable to route FAST to GH' );
        Halt;
      end;
   end;
begin
   mapMaker.map2img.ClearTheImage;
```

The following code is part of the main procedure body. The device connection information obtained from the foregoing code is passed back to the development kernel program 34 to allow the development kernel to generate a bit map configuration file 34, which is used to program the PLD. The first three lines in the loop are for initialization. The fourth line is a link into a data structure of the development kernel program 32A. This instruction returns information describing the global horizontal line which controls the output enable of the input-output element.

```
for rlio := MIN_RLIO to MAX_RLIO do
   begin
      fastToOE [ rlio ].ll     := LL_NO_CON;
      fastToOE [ rlio ].lm     := LM_NC;
      fastToOE [ rlio ].column := COL_URAM;
      fastToOE [ rlio ].gh := GH_TO_OE [ rlio ];
      SetupFastToGH;
   end;
```

The following code sets up the architecture bits and inversion bits of the bit map, as more fully specified below. The next several lines of code are used to loop through the different rows of the PLD.

```
for row := MIN_ROW to MAX_ROW do
   begin
      for rlio := MIN_RLIO to MAX_RLIO do
         begin
```

The next lines of code are used to set the input-output cell architecture bits. More particularly, the next line of code instructs the development kernel 32 to generate a bit pattern to set a value "$0084" for a target cell "rlio" of the specified "row". The next line of code can be considered an implementation instruction specifying a physical element ("rlio") of the programmable logic device, its location (specified by "row"), and an operation the physical element is to perform (set a value of "$0084"). The development kernel program 32 merely maps the parameters (row, rlio, $0084) and function "mapMaker.SetRLIOArch" passed to it to a stored set of bit patterns that will implement the specified operation. This conversion operation is mechanical in nature. Thus, the programming of the development kernel 32 is not critical. The important aspect of the development kernel program 32 is that it stores the required information (bit pattern) for the specified PLD, so that the programmer does not have to know the bit pattern, but instead can specify a functional operation in the source code of the configuration program 30 so that the bit pattern is generated by the development kernel 32.

```
ok:=mapMaker.SetRLIOArch (row, rlio, $0084),
ok:=mapMaker.SetRLIORPI (row, rlio, TRUE);
```

The following code specifies that the output enable should be set so that it is controlled by a global horizontal line. Observe once again that a functional source code statement of the configuration program 30 is used to force the development kernel 32 to generate a bit pattern to implement the function, without requiring the programmer to have detailed information regarding the internal architecture of the PLD. Instead, this detailed information is available in the development kernel 32.

```
ok := mapMaker.SetRLIOSS (row, rlio IOSS_OE, G_GH );
if ok <> CONNECT_OK then
   begin
      Writeln ( 'Error setting RLIO SS.' );
      Halt ( 1 );
   end;
```

The following code is used to instruct the development kernel 32 to connect a specified logic array block 100 to a specified global horizontal line.

```
ok := mapMaker.SetLABGHIn ( row, fastToOE [ rlio ].column, FAST_0,
      fastToOE [ rlio ].ll );
         if not ( ok in [ CONNECT_OK, SAME_BIT_SET_ALREADY ] ) then
            begin
               Writeln ( 'Error setting FAST TO OE GHIN.' );
               Halt ( 1 );
            end;
```

The following code is used to instruct the development kernel 32 to connect a specified logic element 104 input line to a specified routing line.

```
lmIn := TLMInEnum ( Ord ( fastToOE [ rlio ].lm ) * 4 );
ok   := mapMaker.SetLABLLToLMIn ( row,
                     fastToOE [ rlio ].column,
                        fastToOE [ rlio ].ll;
                        lmIn );
if not ( ok in [ CONNECT_OK ] ) then
   begin
```

-continued

```
   Writeln ( 'Error setting FAST TO OE LL to LMIn,' );
   Halt ( 1 )
end;
```

The following code is used to instruct the development kernel 32 to set the bits in the specified logic element 104.

```
mapMaker.SetLUT    ( row,
          fastToOE [ rlio ].column,
          fastToOE [ rlio ].lm,
          $8000 );
```

The following code is used to instruct the development kernel 32 to set up the logic module architecture bits to allow the control signal to be driven from the specified logic element 104.

```
mapMaker.SetLMArch ( row,
          fastToOE [ rlio ].column,
          fastToOE [ rlio ].lm,
          [ SC ] );
```

The following code is used to instruct the development kernel 32 to set up the driver signals to drive the control signal out of the specified logic array block 100.

```
ok := mapMaker.SetLMToGH ( row,
               fastToOE [ rlio ].column,
               fastToOE [ rlio ].lm );
if not ( ok in [ CONNECT_OK ] ) then
   begin
      Writeln ( 'Error setting FAST TO OE GH driver.' );
      Halt ( 1 ),
      end;
   end;
end;
```

The foregoing code constructs the bit map defining the configuration file 34. The following code is used to generate the test or vector file 36. The test generation program 30 is used to functionally describe the tests to be performed. The development kernel 34A, in this embodiment, merely operates to map a package pin with a known functionality (e.g., a specified FAST pin) to a specific physical pin of the PLD package. This information is then written to the test file 36. In general, the following code operates to specify a test operation and the results that should be generated from that operation. The following code sets non-input/output bits and provides header information for the test file 36.

```
Procedure MakeVector;
   Procedure SetNONIO;
   begin
      p2vGen.SetVectorData ( 'MSEL0' );
      p2vGen.SetVectorData ( 'MSEL1' );
      p2vGen.SetVectorData ( 'NSTATUS' );
      p2vGen.SetVectorData ( 'CONDONE' );
      p2vGen.SetVectorData ( 'NCONFIG' );
   end;
begin
   OpenVector ( 18 );
   Comment ( 'This vector tests the RLIO mux which routes a gh line to
        the register OE control' );
   Comment ( 'Fast0 drives all OE controls' );
   Gap;
   DumpVectorHeader;
   Gap;
   p2VGen.SetAllVectorData;
   p2vGen.ClearVectorData ( 'NCEO' );
   p2vGen.PrintVectorData ( ' IO ', ';', vectorFile );
```

The following code generates a test file 36 to drive test signals through the FAST pin and to read the resultant output signals from a specified pin. Drive and compare commands (DRCMIP) are used to insure that the output signal matches the expected output signal.

```
p2vGen.ClearAllVectorData;
IOToggle ( TRUE, [], ALL_TBIO_SET );
p2vGen.PrintVectorData ( ' MASK ', ';',vectorFile );
Gap;
Comment ( 'Drive the OE control high. Make sure that the RLIOs float.' );
Gap;
p2vGen.ClearAllVectorData;
SetAllIO;
IOToggle ( FALSE, ALL_RLIO_SET, [] );
SetNonIO;
p2vGen.SetVectorData ( 'FAST0' );
p2vGen.PrintVectorData ( ' DR ', ';', vectorFile);
p2VGen.SetAllVectorData;
p2vGen.ClearVectorData ( 'NCEO' );
ClearAllIO;
IOToggle ( TRUE, ALL_RLIO_SET, [] );
p2vGen.PrintVectorData ( 'IO ', ';', vectorFile );
p2vGen.ClearAllVectorData;
IOToggle ( TRUE, [],ALL_TBIO_SET);
SetNonIO;
p2vGen.SetVectorData ( 'FAST0' );
p2vGen.PrintVectorData ( 'DRCMP', ';', vectorFile );
Gap;
p2VGen.SetAllVectorData;
```

-continued

```
    p2vGen.ClearVectorData ( 'NCEO' );
    p2vGen.PrintVectorData ( 'IO ', ';',vectorFile);
    p2vGen.ClearAllVectorData;
    SetNonIO;
    p2vGen.SetVectorData ( 'FASTO' );
    p2vGen.PrintVectorData ( 'DR ', ';', vectorFile);
    p2VGen.SetAllVectorData;
    p2vGen.ClearVectorData ( 'NCEO' );
    ClearAllIO;
    IOTOggle (TRUE, ALL_RLIO_SET, []);
    p2vGen.PrintVectorData ( ' IO ', ';', vectorFile);
    p2vGen.ClearAllVectorData;
    SetNonIO;
    p2vGen.SetVectorData ( 'FASTO' );
    p2vGen.PrintVectorData ( 'DRCMP ', ';', vectorFile);
    Gap;
    Comment ( 'Drive the OE control LOW, enabling the TBIOs,
        driving them to one.' );
    Gap;
    p2VGen.SetAllVectorData;
    p2vGen.ClearVectorData ( 'NCEO' );
    ClearAllIO;
    IOTOggle (TRUE, ALL_RLIO_SET, [] );
    p2vGen.PrintVectorData ( ' IO ', ';', vectorFile );
    p2vGen.ClearAllVectorData;
    IOToggle ( TRUE, [], ALL_TBIO_SET );
    SetNonIO;
    p2vGen.PrintVectorData ( ' DRCMP ', ';', vectorFile);
    Gap;
    AppendVectorTail;
    CloseVector;
end;
```

The following code calls the foregoing procedure.
MakeVector;

The foregoing code is a single example of an implementation of the invention. Those skilled in the art will recognize that the code includes a number of design details and commands that are unique to the particular implementation. The invention should not be construed as limited to these details. More importantly, the invention should not be obscured by these details. The example serves to demonstrate that functional source code statements in the configuration program 30 are used to generate a configuration file 34. The development kernel 34 operates to map the functional source code statement to a bit pattern that implements that functionality. The nature of the bit pattern is dependent on the particular device that is being programmed, thus, there is a different development kernel for each type of device. The test generation program 30 also operates to construct a test file. The test generation program 30 specifies the functional operations to be executed. In this context, the development kernel 32 only provides device-specific information on package pin mapping that allows the functional operations to be performed.

The foregoing description, for purposes of explanation, used specific nomenclature to provide a thorough understanding of the invention. However, it will be apparent to one skilled in the art that the specific details are not required in order to practice the invention. In other instances, well known circuits and devices are shown in block diagram form in order to avoid unnecessary distraction from the underlying invention. Thus, the foregoing descriptions of specific embodiments of the present invention are presented for purposes of illustration and description. They are not intended to be exhaustive or to limit the invention to the precise forms disclosed, obviously many modifications and variations are possible in view of the above teachings. The embodiments were chosen and described in order to best explain the principles of the invention and its practical applications, to thereby enable others skilled in the art to best utilize the invention and various embodiments with various modifications as are suited to the particular use contemplated. It is intended that the scope of the invention be defined by the following Claims and their equivalents.

I claim:

1. A computer readable memory to direct a computer to function in a specified manner, comprising:

a dynamic configuration and test generation program to specify, in source code, a logic function to be implemented by a programmable logic device, wherein said dynamic configuration and test generation program includes an implementation instruction specifying a physical element of said programmable logic device, its location in said programmable logic device, and an operation said physical element is to perform; and a device test development kernel program with information characterizing physical elements of said programmable logic device and bit patterns for implementing connections between said physical elements of said programmable logic device, said device test development kernel program converting said logic function into a configuration file for use in programming said logic function into said programmable logic device;

wherein said dynamic configuration and test generation program specifies, in source code, a test operation to be executed by said programmable logic device, and obtains information characterizing a physical element of said programmable logic device from said device test development kernel program, to produce a vector file for use in testing said programmable logic device.

2. The apparatus of claim 1 wherein said dynamic configuration and test generation program includes instructions to query said device test development kernel program on how to make a connection between specified physical elements of said programmable logic device.

3. The apparatus of claim 1 wherein said device test development kernel program responds to said implementation instruction by creating a bit pattern corresponding to said implementation instruction.

4. The apparatus of claim 1 wherein said information characterizing said physical element of said programmable logic device is a package pin assignment.

5. The apparatus of claim 1 further comprising a kernel generator program to construct said test development kernel program.

6. The apparatus of claim 5 further comprising a design file corresponding to said programmable logic device, said design file being accessed by said kernel generator program to construct said device test development kernel program.

7. A computer readable memory to direct a computer to function in a specified manner, comprising:

- a dynamic configuration and test generation program to specify, in source code, a logic function to be implemented by a programmable logic device;
- a device test development kernel program with information characterizing physical elements of said programmable logic device and bit patterns for implementing connections between said physical elements of said programmable logic device, said device test development kernel program converting said logic function into a configuration file for use in programming said logic function into said programmable logic device;
- a kernel generator program to construct said test development kernel program; and
- a design file corresponding to said programmable logic device, said design file being accessed by said kernel generator program to construct said device test development kernel program;
- wherein said kernel generator program constricts a plurality of test development kernel programs from a corresponding plurality of design files characterizing a corresponding plurality of programmable logic devices that share a common internal architecture that is scaled to different sizes.

8. A method of programming a programmable logic device, said method comprising the steps of:

- specifying a source code logic function to be implemented by a programmable logic device;
- converting said source code logic function into a configuration file, wherein said converting step includes the step of using a device test development kernel program with information characterizing physical elements of said programmable logic device and bit patterns for implementing connections between said physical elements of said programmable logic device to produce said configuration file;
- creating said test development kernel program from a design file corresponding to said programmable logic device;
- creating a plurality of test development kernel programs from a corresponding plurality of design files characterizing a corresponding plurality of programmable logic devices that share a common internal architecture that is scaled to different sizes; and
- downloading said configuration file into a programmable logic device.

9. The method of claim 8 wherein said specifying step includes the step of specifying a source code test operation to be executed by said programmable logic device, said converting step includes the step of converting said source code test operation into a test file, and said downloading step includes the step of applying said test file to said programmable logic device.

10. The method of claim 8 wherein said specifying step includes the step of specifying instructions to query said device test development kernel program on how to make a connection between specified physical elements of said programmable logic device.

11. The method of claim 8 wherein said specifying step includes the step of responding to said implementation instruction by creating a bit pattern corresponding to said implementation instruction.

12. The method of claim 8 further comprising the step of creating said test development kernel program from a design file corresponding to said programmable logic device.

* * * * *